United States Patent [19]

Moran

[11] Patent Number: 5,075,259

[45] Date of Patent: Dec. 24, 1991

[54] METHOD FOR FORMING SEMICONDUCTOR CONTACTS BY ELECTROLESS PLATING

[75] Inventor: John D. Moran, Mesa, Ariz.

[73] Assignee: Motorola, Inc., Schaumburg, Ill.

[21] Appl. No.: 396,713

[22] Filed: Aug. 22, 1989

[51] Int. Cl.$^5$ .................. H01L 21/208; H01L 21/205
[52] U.S. Cl. .................................. 437/230; 437/247; 437/245; 427/98
[58] Field of Search ............. 437/230, 245, 247, 248, 437/946, 966, 187, 176; 357/67, 71; 427/98; 156/278; 174/52.4

[56] References Cited

U.S. PATENT DOCUMENTS

| | | | |
|---|---|---|---|
| 3,597,834 | 8/1971 | Lathrop et al. | 437/230 |
| 4,152,824 | 5/1979 | Gonsiorawski | 136/255 |
| 4,182,781 | 1/1980 | Hooper et al. | 437/230 |
| 4,297,393 | 10/1981 | Denning et al. | 437/245 |

Primary Examiner—Olik Chaudhuri
Assistant Examiner—David E. Graybill
Attorney, Agent, or Firm—Robert M. Handy; Eugene A. Parsons

[57] ABSTRACT

Semiconductor device structures having very smooth surfaces and very high doping levels of opposite types present on the same wafer may be plated in the same electroless plating bath without differentiation between the N and P regions or rough and smooth surface regions. This is achieved by a pre-treatment involving coating the wafer surface with a metal salt (e.g., NiCl in glycol and water) and reducing the metal salt in an oxygen free atmosphere (e.g., hydrogen) at a temperature (e.g., >300° C. for Si) sufficient to promote formation of an intermetallic between the reduced metal and the semiconductor substrate. This provides very uniform and effective nucleation sites for the subsequent electroless plating process irrespective of the smoothness, doping type and doping density of the semiconductor surface.

20 Claims, 2 Drawing Sheets

METHOD FOR FORMING SEMICONDUCTOR CONTACTS BY ELECTROLESS PLATING

FIELD OF THE INVENTION

This invention concerns an improved method for forming contacts to semiconductors, especially doped semiconductors, and more particularly, an improved method for forming contacts to semiconductors by electroless plating.

BACKGROUND OF THE INVENTION

It is well known to use electroless plating for applying metal contacts to semiconductors. Generally, there are two problems that must be overcome, residual interfacial oxide and non-uniform plating. Various techniques have been developed in the prior art to attempt to overcome these problems.

U.S. Pat. No. 3,535,176 describes electroless plating of nickel on silicon surfaces exposed in oxide windows. Residual oxide in the window interferes with the electroless plating and/or produces high contact resistance. Residual oxide is removed prior to plating by heating the wafer to 400°-600° C. and evaporating or sputtering an active metal (e.g., Al or Ti) on the surface to reduce the residual oxide and act as an oxygen scavenger. The metal and scavenged oxide are etched away and the electroless nickel plating applied.

In U.S. Pat. No. 3,453,501, semiconductor contacts are provided by first vapor depositing and sintering a thin Al layer, second vapor depositing and sintering a thin Ag layer, and then applying nickel by electroless plating.

U.S. Pat. No. 3,711,325 describes preparation of semiconductor surfaces for electroless nickel plating by first activating the surfaces by immersion in aqueous HF containing 10 ppm $Au^{+3}$ and then quickly transferring it to the electroless nickel plating bath. The HF solution removes any residual oxide and leaves behind sufficient Au ions to promote uniform electroless nickel deposition.

In U.S. Pat. No. 3,949,120, electrical contacts are to an $N+PP+$ silicon structure formed by diffusing phosphorous and boron into opposite faces of a P-type starting wafer and then, on both sides of the wafer, (i) applying a first electroless Ni layer from an aqueous solution containing nickel chloride and sodium perphosphate, sintering the Ni layer between 300°-950° C. to form nickel silicide, (ii) applying a second electroless Ni layer, (iii) applying an electroless Au layer over the second Ni layer and sintering at 800°-1200° C. to drive Ni and Au into the semiconductor substrate, (iv) applying a third electroless Ni layer on the preceding layers, and (v) applying a second Au layer on the third Ni layer.

In U.S. Pat. No. 4,419,390, non-plateable semiconductor surfaces are rendered plateable by first immersing the semiconductor in a nucleation promoter containing Ni, Co, Fe, or Cu ions and a reducing agent capable of chemically interacting with both with the semiconductor and these metal ions in the promoter solution to the metallic state. This pre-treatment forms nucleation sites which catalyze the subsequent electroless deposition.

U.S. Pat. Nos. 3,772,078 and 3,772,056 describe enhancement of electroless plating of various non-semiconductor substrates by pre-treatment of the surfaces with metallic salts which on exposure to radiant energy or aqueous chemical reducing agents are converted to a layer of metal nuclei which is non conductive but capable of catalyzing the subsequent electroless plating reaction.

U S. Pat. Nos. 3,993,491 and 3,993,799 describe enhancement of electroless plating of various non-semiconductor dielectric substrates by coating the surface with a hydrous oxide colloid of precious metal ions or aqueous solution of stannous or copper ions, followed by contacting the surface with an aqueous reducing agent capable of reducing the valence state of the metal ions, followed by immersion in the electroless plating bath.

The foregoing U.S. patents are incorporated herein by reference. Another way to enhance electroless plating of semiconductor surfaces is to use surfaces that are microscopically rough, e.g., have large numbers of atomic lattice defects in the surface that can act as nucleation sites.

The above-mentioned prior art electroless plating techniques suffer from a number of limitations well known in the art, especially when applied to semiconductor substrates. For example, unlike many dielectric or metal surfaces, the tendency of semiconductor surfaces to react in the electroless plating bath is dependent on the semiconductor doping level. For example, a plating bath which is effective in plating a P-type surface may not be effective in plating an N-type surface and vice-versa. The higher the doping level the greater the effect. This can be overcome by using surfaces that are sufficiently rough (microscopically) so that the selective plating effect is overwhelmed by the number of nucleation sites provided by the surface structural defects.

While the selective plating effect has not been important or often not even recognized in the past because of the comparatively high level of inherent surface defects, this is no longer true. There is now an increasing desire to minimize surface defects, even those minute surface defects that can act as nucleation sites for plating. Semiconductor wafers are now being polished to degrees of smoothness and surface perfection that were unheard of a few years ago. Thus, a need continues to exist for improved methods of surface activation for electroless plating of semiconductors, especially where oppositely doped regions are present on very smooth substrates.

As used herein, the words "metal salt" or "metal salts" are intended to refer to any reducible metal or semiconductor bearing compound, including but not limited to organic or inorganic metal and/or semiconductor compounds. Non- limiting examples are metal or semiconductor halides and silanes.

SUMMARY OF THE INVENTION

It is an object of the present invention to provide an improved method for forming contacts on semiconductor surfaces by electroless plating. It is a further object to provide such improved method as will work with very smooth surfaces. It is an additional object to provide such improved method as will permit simultaneous plating on both N and P regions on the same substrate, independent of surface smoothness.

The foregoing and other objects and advantages are achieved by a method for forming contacts on semiconductors, comprising, applying a reducible cation bearing material to a surface of the semiconductor, reducing the material in an oxygen free ambient, reacting the cation reduced from the material with the semiconductor surface to produce an activated surface, and electroless plating the activated surface with a further metal. Nickel or cobalt or mixtures thereof are examples of suitable cations to be incorporated in the reducible material. It is desirable that the reacting step produces a silicide (or equivalent for other semiconductors) of the reduced cation on the surface. The electroless plating step is surface catalyzed by the metal silicide.

After the electroless plating step, the further metal is alloyed into the semiconductor. It is desirable after alloying to repeat the electroless plating step.

The method is suitable for simultaneously forming contacts on semiconductor regions of opposite conductivity type in the same electroless plating bath. It works well even when one or both of the opposite conductivity type regions are heavily doped and the regions to be plated are so smooth as to otherwise be substantially non-plateable.

The invented method will be better understood by considering the accompanying figures and explanation that follow.

DETAILED DESCRIPTION OF THE FIGURES

For convenience and not intended to be limiting, silicon is taken as the exemplary semiconductor and metal salts as the cation bearing material, but the description herein applies as well to other semiconductors and to various doping levels and doping types, and to other cation bearing materials.

Figure 1A:
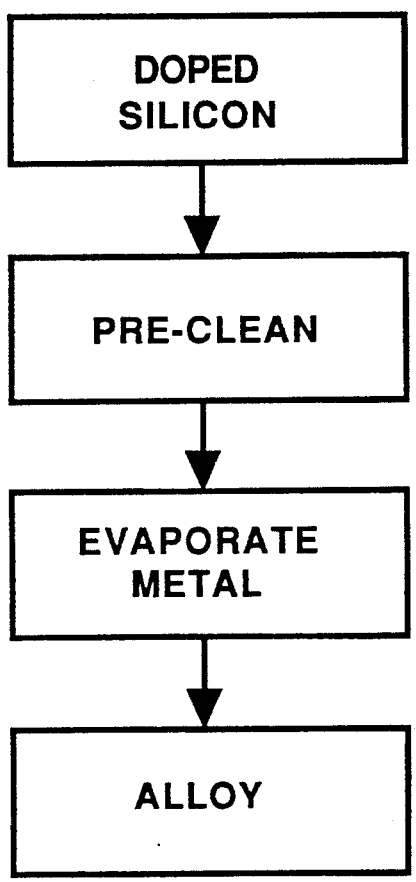
FIGS. 1A-B show simplified flow charts of prior art methods of providing contacts to semiconductors.
Figure 1B:
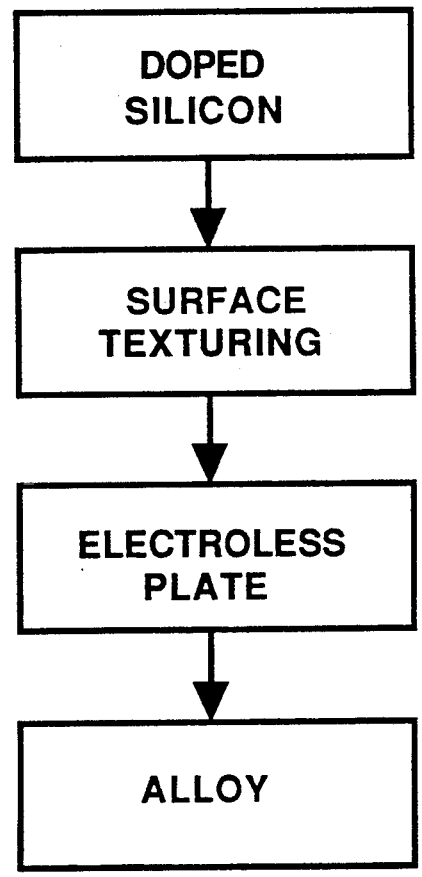

FIG. 1A shows a simplified process flow chart of a prior art contact method using evaporated metal and FIG. 1B shows a simplified process flow chart of a prior art contact method using electroless plating, as for example, electroless nickel plating on a roughened surface. Plating baths and techniques for electroless plating of nickel and other metals are well known in the art. In general, the process of FIG. 1A is more expensive than that of FIG. 1B because of the higher cost of the evaporation equipment.

In order to insure that uniform plating is obtained on both N and P regions of the substrate, the surfaces to be plated in the process of FIG. 1B are textured prior to immersion in the plating bath. Texturing may be accomplished by mild mechanical abrasion, chemical etching and/or sputtering. Such techniques are well known in the art.

A difficulty with the contact process of FIG. 1B is that it becomes increasingly difficult to obtain uniform, non-selective plating when surface texturing must be avoided, when the doping density of either P or N regions or both is high, and when very smooth, defect free surfaces are present. These and other difficulties are avoided by the invented process, shown by way of example and in simplified form by the flow chart of FIG. 2.

Figure 2:
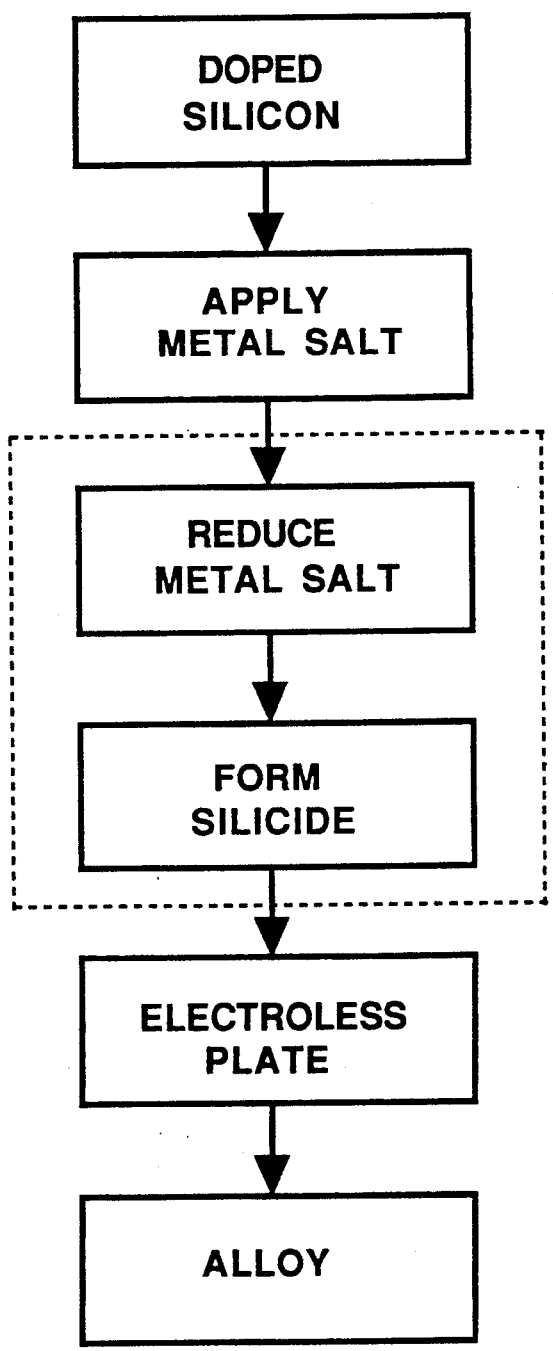
FIG. 2 shows a simplified flow chart of a preferred embodiment of the present invention.

Referring now to FIG. 2, a semiconductor starting wafer of, for example, silicon having one or more doped regions thereon, is first coated with a cation bearing material (e.g., a metal salt) able to provide, on reduction, a cation which bonds strongly to the substrate surface and catalyzes the electroless plating reaction thereon. An example of a suitable material is a reducible metal salt dissolved in a suitable carrier. It has been found that salts of cobalt and nickel are particularly convenient. Nickel or cobalt chloride or mixtures thereof in ethylene or propolyene glycol (E/P-G) and water are suitable. Relative concentrations by weight in the range of 2-6% ($NiCl_2$ and/or $CoCl_2$), 0-98 % (E/P-G) and balance water are useful with about 4% ($NiCl_2$ and/or $CoCl_2$), 90 % (P-G) and 6 % $H_2O$ being typical. Nickel acetate is also suitable as the metal salt. Other carriers which will dissolve or contain sufficient quantity of finely dispersed metal salt may be used in place of the glycol-water mixture. After the mixture is applied, as for example by spraying or spinning, it is dried.

Salts of other cations may also be used Silicon, germanium, gold, silver, copper, palladium, platinum and iridium are examples of other cations that may be used to provide the desired plating nucleation sites. When other cation containing compounds and/or other carriers are used, it is important that the layer formed therefrom be such that it can be reduced to a cation layer or cation nuclei which form a compound with or otherwise firmly bond to the substrate, and which also catalyze the electroless plating process on the substrate surface. For example, cations that form a silicide with a silicon substrate or an analogous compound with other semiconductor substrates are desirable. Homologous cation materials, e.g., silicon nuclei on a silicon substrate, are believed to function as plating activators by providing an atomically rough surface rather than by introducing a difference in electro-chemical potential.

Once the metal salt has been applied and dried, the substrate is heated in an oxygen free atmosphere to a temperature high enough to (i) reduce the cation and (ii) provide for reaction of the reduced cation with the semiconductor substrate to form a chemical compound or otherwise firmly bond therewith, while (iii) avoiding damage to device structures previously formed in or on the semiconductor substrate. Non-limiting examples of compounds formed by this reaction are nickel or cobalt silicide or germanide, nickel gallium arsenide, or other intermetallic or metal-semiconductor or semiconductor-semiconductor compound, depending upon the combination of materials being used. The silicide or equivalent layer so formed is extremely thin.

With silicon substrates, temperatures exceeding about 300° C. are sufficient to reduce the metal salts and provide for formation of nickel or cobalt or other silicide and temperatures below about 900° C. are low enough to avoid damaging most temperature sensitive device regions or layers that may already be present before the contacts are formed. It was found that 300°-450° C. was a particularly useful temperature range for the reduction-reaction steps. Good results were obtained in a reasonable time at 350° C.

Hydrogen or hydrogen containing gases are preferred for the ambient during reduction of the metal salt and silicide formation, but other oxygen free ambients may also be used. It is important to prevent interfacial oxide formation during the reduction and silicide formation, and to reduce or break-up any thin native oxide or other contaminant layer that might be present on the semiconductor surface where contact is desired. The hydrogen in the ambient fosters reduction of the metal salt and, through formation of HCl during decomposition of the nickel or cobalt chloride, promotes mild etching of the semiconductor surface which tends to loosen any native oxide or contamination and thereby expose the semiconductor surface for reaction with the reduced metal to form a silicide (or equivalent).

Following reduction of the salt and formation of the silicide (or equivalent) the treated substrate is placed in a conventional electroless plating bath where it is observed that uniform plating is obtained irrespective of the degree of smoothness of the semiconductor surface and independent of the doping level or conductivity type of the semiconductor region being contacted, even when oppositely doped regions are present on the same substrate in the same bath. Following plating, the substrate is further heated to alloy the electroless plating with the semiconductor substrate. It is desirable but not essential to repeat the electroless plating step with the same or other metals to increase the thickness of the metal contact and/or provide an outer metal surface having the desired chemical and metallurgical properties for the bonding steps to follow. Such bonding steps are well known in the art and will not be described here.

The steps of reducing the metal salt and forming the silicide may be done sequentially or, as indicated by the dashed line in FIG. 2, simultaneously. When done sequentially, the substrate is first heated to a lower temperature, e.g., about 100°–300° C. to reduce the metal salt and then heated to a higher temperature, e.g., >300° C. to react the metal with the substrate to form the silicide. The oxygen free atmosphere is important during both steps to prevent formation of oxide regions on the semiconductor surface that might increase contact resistance and interfere with silicide formation. The use of a hydrogen containing ambient is desirable.

EXAMPLE

Silicon wafers having diameters of about 75–100 mm were diffused to provide P+PN+ or P+NN+ structures using conventional techniques. Boron and phosphorous were used as dopants. The surface concentrations of the P+ and N+ layers was varied, with the highest values equal to the solid solubility limit for these dopants in silicon at the diffusion temperatures (e.g. 1100°–1300° C.). Junction depths were typically about 0.05–0.08 mm and wafer thicknesses were typically about 0.2–0.3 mm. Means for providing such structures are conventional and well known in the art. Following diffusion, the wafers were briefly dip etched to remove residual oxide. Those of skill in the art will appreciate that there is always some oxide present even following such an oxide removal etch because a thin layer of oxide rapidly reforms in air even at room temperature.

The wafers were then coated with a 4% NiCl+90% P-G+6% water solution and air dried. They were then heated to about 350° C. in hydrogen for about 10 minutes to reduce the metal salt and react the reduced metal with the substrate to form a nickel silicide.

The metal and/or metal-silicide mixture formed on the semiconductor surface following the heating operation is very thin, e.g., of the order of 0.005–0.05 micrometers, generally about 0.01 micrometers, but conductive and grossly continuous. Test layers prepared by reduction of the same metal salt layers on glass slides had a bright metallic appearance and were conductive to spaced-apart electrical probes but still thin enough to be slightly transparent to a bright light.

Adhesion tests were performed on silicon die about 4 mm square cut from wafers that had been treated in the above-described manner and covered with electroless plated nickel (EPN). The lower EPN surfaces of these die were attached to a Cr/Ni/Au coated glass plate using conventional Pb/Sn or Pb/In/Ag solders. These solders are frequently used in the manufacture of semiconductor devices to mount the semiconductor die to the package header or leadframe. A nickel sheet about 0.08 mm thick was soldered to the top EPN surfaces of the die using the same solders. The glass plate was firmly clamped to a test bench, the upper nickel sheet was peeled away, and the location of the mechanical failure within the glass-Cr/Ni/Au-solder-EPN-silicon-EPN-solder-Ni sheet sandwich determined by inspection.

This procedure provides a simple but effective test of whether the adhesion of the electroless plated film to the semiconductor is sufficient for practical usage. If separation failure occurs in or on the electroless plated nickel (EPN) layer, then the plating process is not satisfactory. If the failure occurs elsewhere, it is. No failures were observed in the electroless plated nickel layer for the samples prepared according to the present invention. This was true even on samples with surface layers doped to the solid solubility limit and with surface layers that were so smooth as to be essentially nonplateable by conventional techniques without surface roughening.

It was found that the above-described soldered nickel sheet peel test of adhesion strength was very successful in detecting changes in die adhesion, and was a better indicator of likely assembly manufacturing success than were familiar prior art adhesion tests commonly used in the industry, such as for example, the sticky-tape peel test or measuring the die bond pull strength using a post attached to the die. Units which passed the soldered nickel sheet peel test described above gave excellent results during assembly and delamination failures of assembled units was reduced to virtually zero. It is expected that units formed according to the invented process will have the same or lower forward voltage drop than prior art units because of the absence of interfacial oxide, the uniformity of the plated contact surfaces and the absence of solder voids previously associated with interfacial oxide and non-uniform plating.

Having described the invention, those of skill in the art will appreciate that it provides an improved method for forming contacts on semiconductor devices by electroless plating, that the process works with semiconductor surfaces of any degree of smoothness, that the process permits doped regions of opposite type on the the same substrate to be simultaneously plated in the same plating bath, and that the process works even when such oppositely doped regions approach saturation dopant levels. Thus, a number of problems encountered with prior art methods are overcome or avoided. Further, the invented process is particularly economical since it does not depend on use of precious metals or precious metal salts or other expensive ingredients.

While the present invention is described in terms of silicon semiconductor material and particular combinations of N and P regions and doping levels, those of skill in the art will understand that this is merely for convenience of explanation and not intended to be limiting and that the present invention applies to other semiconductor materials, other combinations of P and N regions and other doping levels.

In addition, while the above-described process has been illustrated in terms of several metal-halide or metal organic compounds as the reducible metal salts, those of skill in the art will appreciate based on the description herein that any cation compound that does not adversely affect the underlying substrate, and whose cation reduction product bonds firmly to the substrate and activates the electroless plating process thereon, may be used in addition to those materials described herein.

These and such other variations as will occur to those of skill in the art based on the description herein are intended to be included in the claims that follow.

I claim:

1. A method for forming contacts on semiconductors, comprising:
    applying a reducible cation bearing compound to a surface of the semiconductor;
    reducing the compound independent of the surface in an oxygen free ambient;
    reacting the cation reduced from the compound with the semiconductor surface to activate the surface for electroless plating; and
    electrolessly plating the activated surface with a further metal.

2. The method of claim 1 wherein the compound comprises nickel or cobalt or mixtures thereof.

3. The method of claim 1 wherein the semiconductor is silicon and the reacting step produces a silicide of the reduced metal on the surface.

4. The method of claim 3 wherein the electrolessly plating step is surface catalyzed by the metal silicide.

5. The method of claim 1 further comprising, after the electrolessly plating step, alloying the further metal with the semiconductor.

6. A method for simultaneously forming contacts on semiconductor regions of opposite conductivity type, comprising:
    providing a semiconductor substrate having a first surface region of a first type and a second surface region of a second opposite type and some residual oxide on at least one of the first and second surface regions;
    coating the first and second regions with a reducible cation bearing compound suitable for surface activation;
    reducing the compound independent of the surface regions in an oxygen free ambient;
    reacting the cation reduced from the compound with the first and second regions to activate the surface thereof for electroless plating; and
    simultaneously electrolessly plating the first and second region with a further metal.

7. The method of claim 6 wherein the compound comprises nickel or cobalt or a combination thereof.

8. The method of claim 6 wherein the semiconductor is silicon and the reacting step produces a silicide on the first and second regions.

9. The method of claim 8 wherein the electrolessly plating occurs preferentially on the silicide.

10. The method of claim 6 further comprising, after the electrolessly plating step, alloying the further metal with the first and second regions.

11. A method for simultaneously forming contacts on semiconductor regions of opposite conductivity type, comprising:
    providing a semiconductor substrate having a first surface region of a first type and a second surface region of a second opposite type, wherein at least one of the regions is heavily doped;
    coating the first and second surface regions with a material containing a cation suitable for forming a compound with the substrate which can catalyze an electroless plating process thereon and thereafter performing the following steps on the first and second regions at the same time;
    reducing the compound independent of the first and second surface regions and without reacting with the heavily doped region, in an oxygen free ambient to yield cation;
    reacting the cation to form a compound with the substrate; and
    electrolessly plating the compound with a further metal.

12. The method of claim 11 wherein the coating step comprises applying the same material to the first and second regions.

13. The method of claim 11 wherein the coating step comprises applying different materials to the first and second regions.

14. The method of claim 11 wherein the material comprises nickel or cobalt or a combination thereof.

15. The method of claim 11 wherein the semiconductor is silicon and the reacting step produces one or more silicides of the cation on the first and second regions.

16. The method of claim 15 wherein electroless plating occurs preferentially on the metal silicide.

17. The method of claim 11 further comprising, after the electrolessly plating step, alloying the further metal with the first and second surface regions.

18. The method of claim 11 wherein both regions are heavily doped.

19. The method of claim 11 wherein the providing step comprises providing smoothly polished first and second surface regions.

20. The method of claim 11 wherein the first and second regions are on opposed faces of the substrate.

* * * * *